United States Patent

Ma et al.

[11] Patent Number: 6,043,656
[45] Date of Patent: Mar. 28, 2000

[54] METHOD FOR COMPENSATING AN MRI SYSTEM FOR RESIDUAL MAGNETIZATION

[75] Inventors: Jingfei Ma, Waukesha; Xiaohong Zhou, Pewaukee; Graeme C. McKinnon, Hartland, all of Wis.

[73] Assignee: General Electric Company, Milwaukee, Wis.

[21] Appl. No.: 09/197,858

[22] Filed: Nov. 23, 1998

[51] Int. Cl.[7] ............................................ G01V 3/00
[52] U.S. Cl. .................................. 324/309; 324/322
[58] Field of Search .................................. 324/309, 307, 324/312, 314, 318, 322

[56] References Cited

U.S. PATENT DOCUMENTS

| | | | |
|---|---|---|---|
| 4,665,365 | 5/1987 | Glover et al. | 324/309 |
| 4,698,591 | 10/1987 | Glover et al. | 324/307 |
| 5,155,436 | 10/1992 | Suzuki et al. | 324/320 |
| 5,442,290 | 8/1995 | Crooks | 324/309 |
| 5,652,517 | 7/1997 | Maki et al. | 324/318 |
| 5,729,139 | 3/1998 | Goto | 324/309 |

*Primary Examiner*—Louis Arana
*Attorney, Agent, or Firm*—Quarles & Brady; Christian G. Cabou; Phyllis Y. Price

[57] ABSTRACT

An MRI system includes a gradient compensation system which appends magnetization reset gradient waveforms to imaging gradient waveforms produced during a scan. The magnetization compensation gradients maintain the residual magnetization in the MRI system at a constant level which reduces image artifacts.

17 Claims, 3 Drawing Sheets

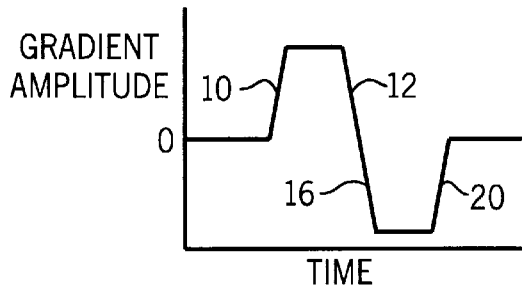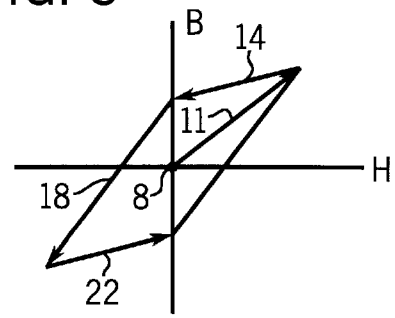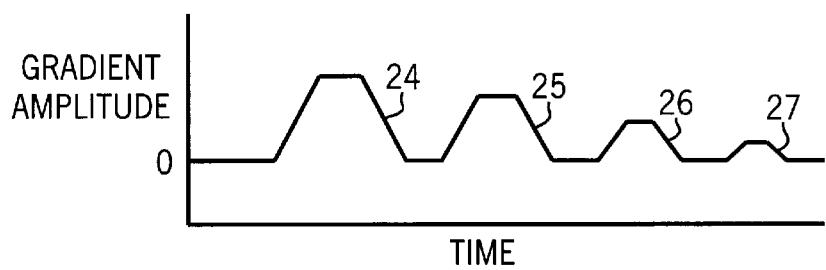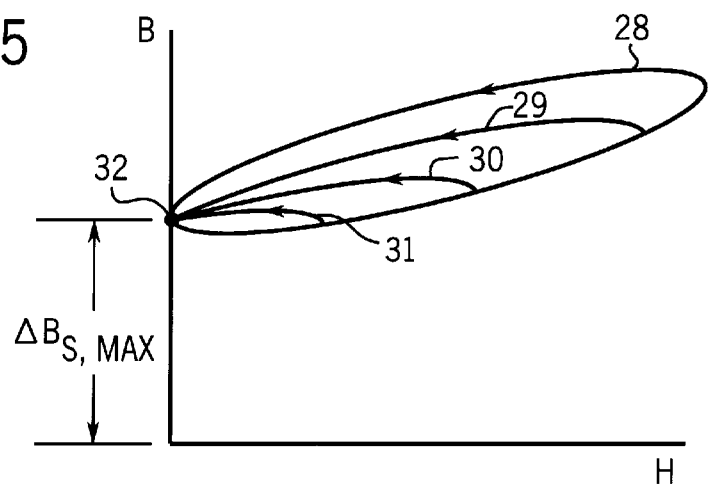

US 6,043,656

METHOD FOR COMPENSATING AN MRI SYSTEM FOR RESIDUAL MAGNETIZATION

BACKGROUND OF THE INVENTION

The field of the invention is nuclear magnetic resonance imaging methods and systems. More particularly, the invention relates to the compensation for residual magnetization produced by magnetic field gradients in MRI systems.

When a substance such as human tissue is subjected to a uniform magnetic field (static field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned magnetic moment, $M_z$, may be rotated, or "tipped", into the x-y plane to produce a net transverse magnetic moment $M_t$. A signal is emitted by the excited spins, and after the excitation signal $B_1$ is terminated, this signal may be received and processed to form an image.

The application of magnetic resonance to imaging, and to many of the techniques of localized spectroscopy, depends upon the use of linear magnetic field gradients to selectively excite particular regions and to encode spatial information within the NMR signal. During the NMR experiments, magnetic field gradient waveforms with particularly chosen temporal variations are used. Any departure from the application of ideal magnetic field gradient waveforms can, therefore, be expected to introduce image distortion, intensity loss, ghosting, and other artifacts. For example, imperfect rephasing of the nuclear spins and an attendant loss of signal occurs if the slice-select magnetic field gradients are not balanced before and after the 180° RF pulses. This effect compounds in later spin echoes of multi-echo (Carr-Purcell-Mieboom-Gill) sequences. In addition, if the gradient field is not zero when it should be (due to residual magnetization after termination of a gradient pulse), the unintended phase dispersion can result in distorted spectra in chemical shift imaging (CSI) sequences as well as inaccurate spin-spin relaxation time ($T_2$) determination in multi-echo sequences. Those skilled in the art are thus concerned particularly about the accuracy with which magnetic field gradients are produced.

One source of distortion in the production of magnetic field gradients can arise if the gradient fields couple to conductive structures within the polarizing magnet such as its cryostat (if the magnet is of the superconductive design), or the shim coil system, or the RF shield used to decouple the gradient coils from the RF coil. The induction of currents in these ambient structures is known as eddy currents. Due to eddy currents, one observes, typically an exponential rise and decay of the magnetic field gradient during and after, respectively, the application of a trapezoid current pulse to the gradient coil.

In U.S. Pat. No. 4,698,591 entitled "A Method for Magnetic Field Gradient Eddy Current Compensation," a method is disclosed which uses an analog pre-emphasis filter in the gradient power supply to shape the current applied to the gradient coil in such a way that the eddy current induced gradient field distortions are reduced. The filter includes a number of exponential decay components and adjustable potentiometers which must be set during system calibration. A measurement technique is used prior to system calibration in which the impulse response of the uncorrected magnetic field gradient is measured and the potentiometer settings for the pre-emphasis filter are then calculated. Such techniques are described in U.S. Pat. Nos. 4,950,994; 4,698,591 and 4,591,789.

In iron-core permanent magnets or iron-core enhanced superconducting magnets, there exists another type of gradient-induced magnetic field perturbation. This perturbation, known as hysteresis, has not been well-studied, and generalized correction techniques have not been fully developed. To understand the hysteresis phenomenon, consider the effects of a bipolar gradient waveform shown in FIG. 2 and assume that the iron magnetization is in an initial state 8 shown in FIG. 3. The initial magnetization state is defined as the un-magnetized state, but in this case, it could be the state after the magnetic field is ramped up but before any gradients have ever been applied. During the first attack ramp, the current in the gradient coil, as well as the magnetic field H experienced by the iron core, is gradually increasing. As a result, the magnetic induction B increases with H, as indicated by curve 11 in FIG. 3. When the gradient is ramped down to zero at 12, however, the magnetic induction B does not return to zero. Instead, its dependence on the magnetic field is characterized by another curve 14. This phenomenon is know as hysteresis, and the remaining magnetic induction ($\Delta B$) is called remanence, or residual magnetization. If the gradient is further ramped down at 16 to a negative value, then the magnetic induction B follows curve 18. With subsequent gradient ramp 20, the H vs. B curve 22 ends with a negative residual magnetization ($-\Delta B$). Subsequent gradient pulses drive the magnetization in a loop, known as the hysteresis loop.

The above analysis indicates that when a time-dependent magnetic field gradient pulse is used for imaging, a perturbation magnetic field $\Delta B$ can be generated in ferromagnetic materials. If the hysteresis effects are uncompensated, a number of image artifacts can be produced. For example, the residual magnetization induced by the phase-encoding gradient pulses in fast spin echo (FSE) can generate inconsistent phase errors in k-space data, leading to image blurring and ghosting.

This problem is addressed in U.S. Pat. No. 5,729,139. The proposed solution in this prior art patent is to correct the phase errors produced by residual magnetization. Ten specific methods for doing this are proposed and all require changes to the gradient pulse waveforms in the particular prescribed pulse sequence. Since there are countless variations possible in the pulse sequences that can be prescribed, it is not practical to alter each one according to the teaching of this prior method.

SUMMARY OF THE INVENTION

The present invention is a method and apparatus for controlling residual magnetization in an MRI system such that image artifacts are reduced. More particularly, the MRI system includes a residual magnetization compensation function which drives the residual magnetization to a preselected state and appends to each nominal imaging gradient waveform a magnetization reset gradient waveform that returns the residual magnetization to the preselected state. Because the residual magnetization is always driven to the same value after every gradient waveform is played out, the phase errors produced in the acquired NMR data are consistently the same throughout the scan. When the acquired NMR data are reconstructed into a magnitude image using a Fourier transformation, this constant phase error is effectively unseen.

The present invention is easy to implement in commercial MRI systems. Because the same magnetization reset gradient waveform may be appended to each imaging gradient waveform, no complicated calculations are required nor is it necessary to customize each possible pulse sequence. The magnetization reset gradient waveform is simply appended at the end of each imaging gradient waveform that is produced by the MRI system during the scan.

BRIEF DESCRIPTION OF THE DRAWINGS

FIG. 2 is a graphic representation of an exemplary imaging gradient waveform produced by the MRI system of FIG. 1;

FIG. 3 is a simplified graphic illustration of the hysteresis curve produced by the imaging gradient waveform of FIG. 2;

FIG. 4 is a graphic representation of a series of gradient waveforms used to explain the theory underlying the present invention;

FIG. 5 is a graphic representation of the hysteresis curves produced by the gradients in FIG. 4;

GENERAL DESCRIPTION OF THE INVENTION

Figure 1:
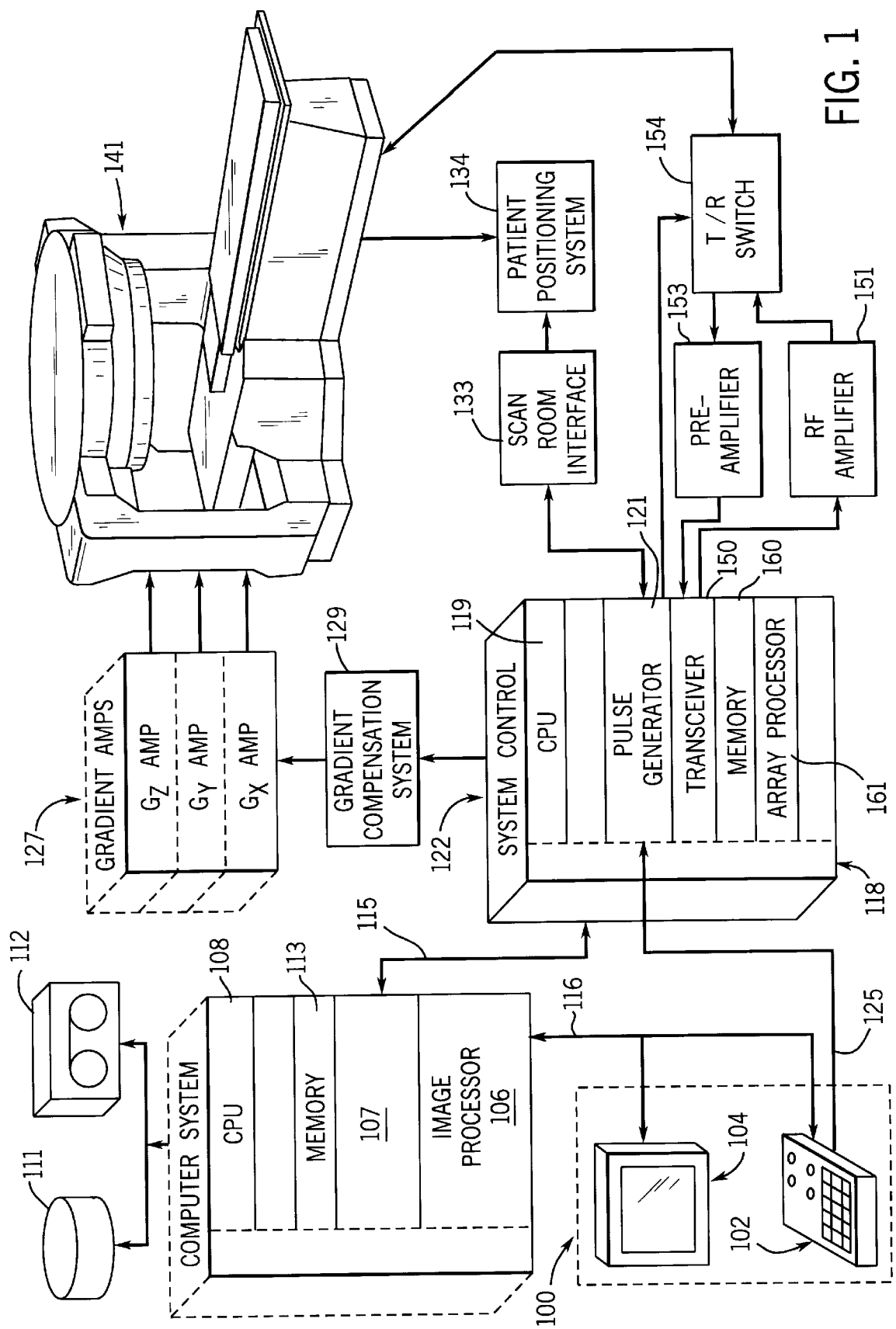
FIG. 1 is a block diagram of an MRI system which employs the present invention.

If a series of gradient waveforms 24–27 of descending amplitude are played out on an MRI system as shown in FIG. 4, the ferromagnetic structures in the MRI system will be driven along the respective hysteresis curves 28–31 shown in FIG. 5. Because the maximum amplitude gradient pulse is applied first, the residual magnetization returns to the same value at point 32 after each gradient waveform is played out. As can be seen, the hysteresis loops of the smaller gradient pulses are nested within the larger hysteresis loop 28 of the first gradient pulse 24. If the first gradient pulse 24 is the maximum amplitude possible on the MRI system, therefore, all subsequent positive gradient pulses will leave the residual magnetization at the same level, $\Delta B_{s,max}$. The same result occurs when a series of negative gradient waveforms are produced, however, in such case the residual magnetization is driven to and remains at a value $-\Delta B_{s,max}$.

The present invention recognizes and takes advantage of the fact that residual magnetization can easily be maintained at $\pm\Delta B_{s,max}$ throughout the MR scan. Any phase error produced by this consistent residual magnetization is not seen in the reconstructed magnitude image because reconstruction is done using a Fourier transformation approach.

The present invention can be implemented in a number of ways. At the beginning of the scan a gradient pulse is applied to drive the residual magnetization to either plus or minus $\Delta B_{s,max}$. If necessary, such a pulse can be played out on all three axes, either sequentially or concurrently. Then, as the gradient waveforms are played out during the imaging pulse sequence, a magnetization reset gradient waveform is appended as necessary to the gradient waveforms to drive residual magnetization back to $\pm\Delta B_{s,max}$. If plus $\Delta B_{s,max}$ is selected, for example, the magnetization reset gradient waveform is a maximum-amplitude positive gradient pulse of very short duration following each negative gradient pulse that is produced during the imaging pulse sequence. If the imaging gradient pulse is positive in polarity, the residual magnetization reset pulse may be omitted according to the theory discussed above with reference to FIG. 5. However, if the imaging gradient pulse is negative in polarity, then the reset pulse must be applied.

In the preferred embodiment described below, the magnetization reset gradient waveform is a bipolar gradient waveform such as that illustrated in FIG. 6. It includes a negative lobe 36 followed by an identical positive lobe 37 to maintain the zeroeth gradient moment. The gradient lobes 36 and 37 have a maximum amplitude possible and their duration is as short as possible. The shortness of the pulse is mainly determined by the slew rate of the gradient amplifiers.

Figure 6:
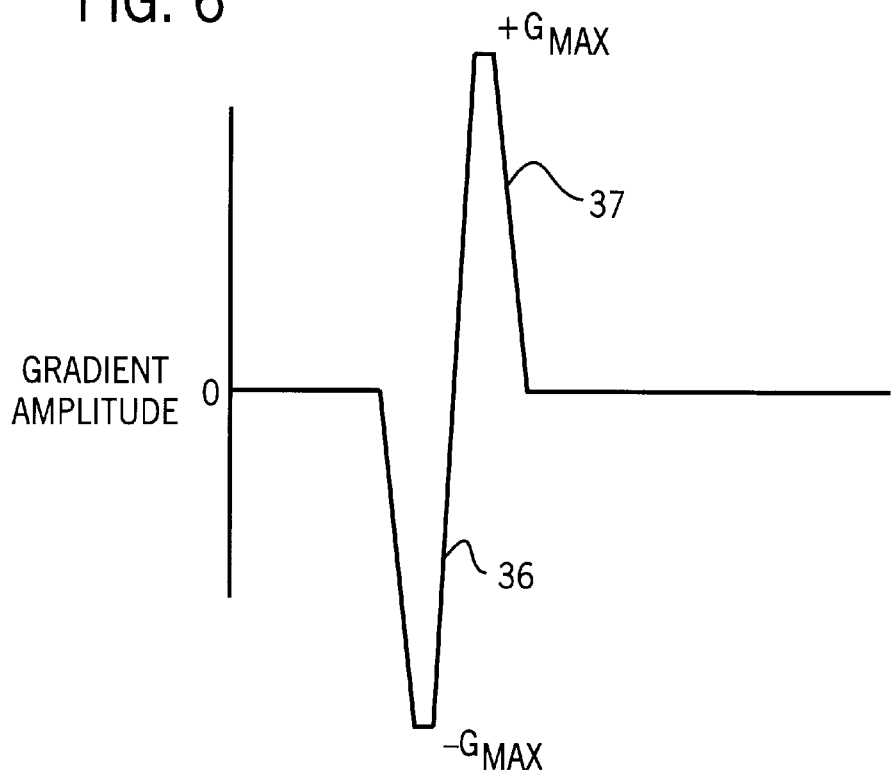
FIG. 6 is a graphic representation of a preferred embodiment of a magnetization reset gradient waveform used in the MRI system of FIG. 1.

The positive lobe 37 of the residual magnetization reset gradient waveform in FIG. 6 drives the residual magnetization to plus $\Delta B_{s,max}$. The negative gradient lobe 36 is equal in area to the positive gradient lobe 37 so that the net area of the entire waveform is zero. This enables the magnetization reset gradient waveform to be appended to imaging gradient waveforms without disturbing the net phase of the transverse magnetization. If the minus $\Delta B_{s,max}$ residual magnetization is selected the polarity of the gradient lobes 36 and 37 is switched such that the last gradient lobe drives the residual magnetization to minus $\Delta B_{s,max}$.

It should be apparent to those skilled in the art that the residual magnetization reset gradient waveform can have many different shapes. For example, it can take a sinusoidal shape where each lobe is at the maximum gradient amplitude. Also, when the imaging pulse sequence includes a refocusing RF pulse, the residual magnetization reset gradient waveform can be divided into two parts, with one lobe played out before the refocusing pulse and the other lobe after the refocusing pulse. Since the spin magnetization is reversed in polarity by the refocusing pulse, the polarity of the two reset gradient lobes remains the same.

DESCRIPTION OF THE PREFERRED EMBODIMENT

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane 118. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects through a gradient compensation system 129 to a set of gradient amplifiers 127, to indicate the timing and shape of the gradient pulses to be produced during the scan. The pulse generator module 121 also connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are compensated by the system 129 as will be described in more detail below and applied to a gradient amplifier system 127 comprised of $G_x$, $G_y$ and $G_z$ amplifiers. Each gradient amplifier excites a corresponding gradient coil (not shown). As is well known in the art, the gradient coils produce linear magnet field gradients used for spatially encoding acquired signals. A magnet assembly 141 also includes a polarizing magnet (not shown) and a whole-body RF coil (not shown). In the preferred embodiment the polarizing field is produced by a permanent magnet and associated iron core used to shape and direct the field as described in U.S. Pat. No. 5,652,517 entitled "Magnet Assembly For MRI Apparatus". It is these elements which become magnetized by the gradient fields and which create the problem addressed by the present invention. However, the present invention is also applicable to other magnet structures such as iron-core enhanced superconducting magnets.

A transceiver module 150 in the system control 122 produces pulses which are amplified by an RF amplifier 151 and coupled to the RF coil in the magnet assembly 141 by a transmit/receive switch 154. The resulting signals produced by the excited spins in the patient may be sensed by the same RF coil and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the RF coil during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil are digitized by the transceiver module 150 and transferred to a memory module 160 in the system control 122. When the scan is completed and an entire array of data has been acquired in the memory module 160, an array processor 161 operates to transform the data into an array of image data. This image data set is conveyed through the serial link 115 to the computer system 107 where it is stored in the disk memory 111. In response to commands received from the operator console 100, this image data may be archived on external drive 112, or it may be further processed by the image processor 106 as will be described in more detail below and conveyed to the operator console 100 and presented on the display 104.

For a more detailed description of the transceiver 150, reference is made to U.S. Pat. Nos. 4,952,877 and 4,992,736 which are incorporated herein by reference.

Figure 7:
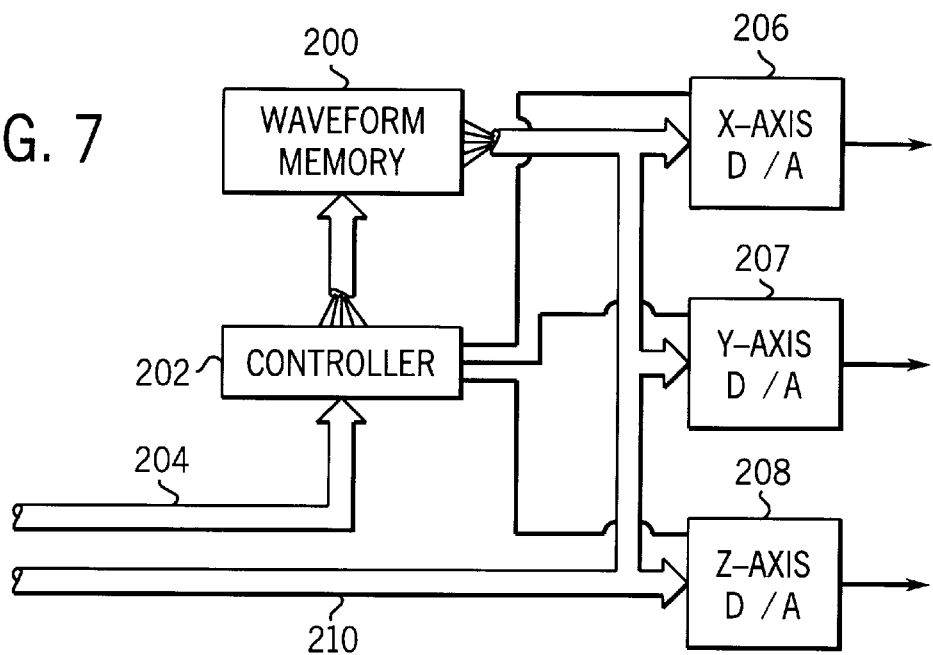
FIG. 7 is an electrical block diagram of a gradient compensation system which forms part of the MRI system of FIG. 1.

Referring particularly to FIGS. 1 and 7, the present invention is implemented in the pulse generator module 121 and the gradient compensation system 129. The gradient compensation system 129 includes a waveform memory 200 which stores in digital form the magnetization reset gradient waveform of FIG. 6. This stored waveform is read out by a controller 202 when the controller receives a command from the pulse generator module 121 over control bus 204.

The digital values read from the waveform memory 200 are applied to one or more A/D converters 206–208 through a data bus 210. The controller 202 enables the appropriate D/A converter(s) 206–208 and reads the waveform from memory 200 to produce analog versions of the waveform in FIG. 6 at the output of one or more A/D converters 206–208. These outputs drive the respective x-axis, y-axis and z-axis gradient amplifiers 127.

When an imaging pulse sequence is performed by the MRI system of FIG. 1, the pulse generator module 121 produces the imaging gradient waveforms on data bus 210 and applies them to the appropriate D/A converter 206–208. The controller 202 is then signaled through control bus 204 to append a magnetization reset gradient waveform such as that shown in FIG. 6. The controller 202 reads the appropriate waveform from the memory 200 and applies it to the appropriate A/D converter(s) 206–208. As discussed above, the magnetization reset gradient waveform may be appended after every imaging waveform produced by the pulse generator module 121, or only after those having a gradient lobe of opposite polarity to the selected plus or minus $\Delta B_{s,max}$.

We claim:

1. A method for reducing image artifacts in MR images caused by residual magnetization in ferromagnetic materials of the MRI system produced by imaging gradient waveforms employed to acquire MR image data during a scan, the steps comprising:

driving the residual magnetization in the ferromagnetic materials of the MRI system to a preselected value; and maintaining the residual magnetization at the preselected value as the MR image data are acquired during the scan by appending a residual magnetization reset gradient waveform to imaging gradient waveforms during the scan.

2. The method as recited in claim 1 in which the preselected value is the maximum residual magnetization that can be produced in the ferromagnetic materials by the imaging gradient waveforms.

3. The method as recited in claim 1 in which the magnetization reset gradient waveform is appended to all imaging gradient waveforms produced during the scan.

4. The method as recited in claim 1 in which the magnetization reset gradient waveform has two identical gradient lobes of opposite polarity.

5. The method as recited in claim 4 in which each gradient lobe produces the maximum possible gradient field in the MRI system.

6. The method as recited in claim 5 in which each gradient lobe is as short in duration as possible.

7. The method as recited in claim 1 in which the step of appending a residual magnetization reset gradient waveform to an imaging gradient waveform includes changing the shape of the imaging gradient waveform.

8. The method as recited in claim 7 in which the duration of the imaging gradient waveform is changed.

9. The method as recited in claim 8 in which the duration of the imaging gradient waveform is increased.

10. The method as recited in claim 8 in which the duration of the imaging gradient waveform is decreased.

11. In an MRI system having a gradient system for producing imaging magnetic field gradients during a scan in response to imaging gradient waveform as produced by a pulse generator, the improvement comprising:

a gradient compensation system coupled to the gradient system to produce a residual magnetization compensation magnetic field gradient after production of each imaging magnetic field gradient;

wherein the residual magnetization in ferromagnetic materials of the MRI system is maintained at a preselected maximum level throughout the scan.

12. The improvement as recited in claim 11 in which the gradient compensation system directs the gradient system to produce the residual magnetization compensation magnetic field after every imaging magnetic field produced during the scan.

13. The improvement as recited in claim 11 in which the gradient compensation system produces a residual magnetization reset gradient waveforms having two identical lobes of opposite polarity.

14. The improvement as recited in claim 13 in which each lobe has the maximum amplitude available on the MRI system.

15. The improvement as recited in claim 11 in which the gradient compensation system produces the residual magnetization reset magnetic field gradient at least in part by changing the imaging magnetic field gradient.

16. The improvement as recited in claim 15 in which the imaging magnetic field gradient is changed by decreasing its duration.

17. The improvement as recited in claim 15 in which the imaging magnetic field gradient is changed by increasing its duration.

* * * * *